US012198992B2

(12) United States Patent
Okamoto et al.

(10) Patent No.: US 12,198,992 B2
(45) Date of Patent: Jan. 14, 2025

(54) ELECTRONIC ELEMENT HOUSING PACKAGE AND ELECTRONIC APPARATUS

(71) Applicant: KYOCERA Corporation, Kyoto (JP)

(72) Inventors: Masanori Okamoto, Kirishima (JP); Sentarou Yamamoto, Kagoshima (JP); Youji Furukubo, Kirishima (JP); Akira Imoto, Kirishima (JP); Aki Kitabayashi, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 17/442,382

(22) PCT Filed: Jan. 11, 2020

(86) PCT No.: PCT/JP2020/000775
§ 371 (c)(1),
(2) Date: Sep. 23, 2021

(87) PCT Pub. No.: WO2020/195018
PCT Pub. Date: Oct. 1, 2020

(65) Prior Publication Data
US 2024/0213108 A1 Jun. 27, 2024

(30) Foreign Application Priority Data
Mar. 25, 2019 (JP) .................. 2019-056842

(51) Int. Cl.
H01L 23/13 (2006.01)
H01L 23/00 (2006.01)
(Continued)

(52) U.S. Cl.
CPC .............. H01L 23/13 (2013.01); H01L 23/15 (2013.01); H01L 23/481 (2013.01); H01L 23/562 (2013.01); H01L 23/564 (2013.01)

(58) Field of Classification Search
CPC ....... H01L 23/13; H01L 23/15; H01L 23/481; H01L 23/562; H01L 23/564
See application file for complete search history.

(56) References Cited

U.S. PATENT DOCUMENTS 5,061,987 A 10/1991 Hsia
5,898,218 A * 4/1999 Hirose .................. B60T 8/3675
257/710

(Continued)

FOREIGN PATENT DOCUMENTS

JP 2011-222662 A 11/2011
JP 2013-073994 A 4/2013
(Continued)

Primary Examiner — Herve-Louis Y Assouman
(74) Attorney, Agent, or Firm — Volpe Koenig

(57) ABSTRACT

An electronic element housing package includes a bottom substrate, a bank portion, and a conductor part, in which the bottom substrate and the bank portion are an integrated object made of ceramic, the bottom substrate includes a region surrounded by the bank portion as a mounting portion for mounting an electronic element, the conductor part includes a first conductor, a second conductor, and a third conductor, the first conductor is partially exposed on a mounting surface of the bottom substrate and embedded in the bottom substrate, at least a part of the third conductor is disposed on an upper surface of the bank portion and a part thereof is exposed, and the second conductor is present between the first conductor and the third conductor inside the bottom substrate and the bank portion and electrically connects the first conductor and the third conductor.

7 Claims, 15 Drawing Sheets

(51) Int. Cl.
*H01L 23/04* (2006.01)
*H01L 23/08* (2006.01)
*H01L 23/15* (2006.01)
*H01L 23/48* (2006.01)

(56) References Cited

U.S. PATENT DOCUMENTS

| | | |
|---|---|---|
| 2013/0075145 A1 | 3/2013 | Kaneko et al. |
| 2016/0007447 A1* | 1/2016 | Funahashi ............ H05K 1/0271 361/767 |
| 2016/0043047 A1* | 2/2016 | Shim ................... H01L 23/5389 438/126 |
| 2016/0044792 A1 | 2/2016 | Kaneko et al. |

FOREIGN PATENT DOCUMENTS

| | | |
|---|---|---|
| JP | 2014-175791 A | 9/2014 |
| JP | 2017-098400 A | 6/2017 |
| JP | 2017-123408 A | 7/2017 |
| JP | 63-13235 B2 | 4/2018 |
| WO | 2018/094162 A1 | 5/2018 |

* cited by examiner

A

B

ELECTRONIC ELEMENT HOUSING PACKAGE AND ELECTRONIC APPARATUS

CROSS-REFERENCE TO RELATED APPLICATIONS

This application is a national stage application of International Application No. PCT/JP2020/000775, filed on Jan. 11, 2020, which designates the United States, the entire contents of which are herein incorporated by reference, and which is based upon and claims the benefit of priority to Japanese Patent Application No. 2019-056842, filed on Mar. 25, 2019, the entire contents of which are herein incorporated by reference.

TECHNICAL FIELD

The present disclosure relates to an electronic element housing package and an electronic apparatus.

BACKGROUND ART

In recent years, electronic element housing packages have become increasingly smaller and thinner as electronic elements such as crystal oscillators become smaller (e.g., see Patent Document 1).

CITATION LIST

Patent Literature

Patent Document 1: JP 2017-98400 A

SUMMARY

An electronic element housing package of the present disclosure includes a bottom substrate, a bank portion, and a conductor part. The bottom substrate and the bank portion are an integrated component made of ceramic. The bottom substrate includes a region that is surrounded by the bank portion and serves as a mounting portion in which an electronic element is mounted. The conductor part includes a first conductor, a second conductor, and a third conductor. A portion of the first conductor is exposed on the surface of the mounting portion of the bottom substrate and embedded in the bottom substrate. At least a portion of the third conductor is exposed on an upper surface of the bank portion. The second conductor is present inside the bottom substrate and the bank portion and electrically connects the first conductor and the third conductor.

The electronic apparatus of the present disclosure includes an electronic element on the bottom substrate of the above-described electronic element housing package.

DESCRIPTION OF EMBODIMENTS

The electronic element housing package disclosed in Patent Document 1 includes a conductor (via conductor) that extends through the bottom substrate in the thickness direction. When the conductor (via conductor) that extends through the bottom substrate in the thickness direction is provided, an interface is formed between the conductor and a bottom surface of the bottom substrate. For this reason, moisture or gas easily permeates the bottom substrate from the bottom surface side.

The present disclosure exemplifies an electronic element housing package with which moisture and gas are less likely to permeate from the bottom surface of the bottom substrate even when the electronic element housing package has been made smaller and thinner.

Hereinafter, the present disclosure will describe various electronic element housing packages in the embodiments with reference to FIGS. 1 to 7. Further, an aspect of the present disclosure is not limited to the specific embodiments described below. An aspect of the present disclosure is assumed to include various aspects provided that these aspects fall within the spirit or scope of the general inventive concepts as defined by the appended claims.

Figure 1:
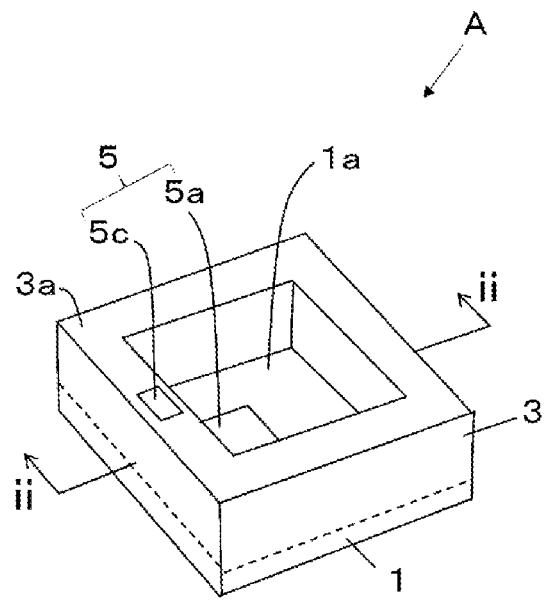
FIG. 1 is a perspective view of an electronic element housing package illustrated as an example of an embodiment.
Figure 2:
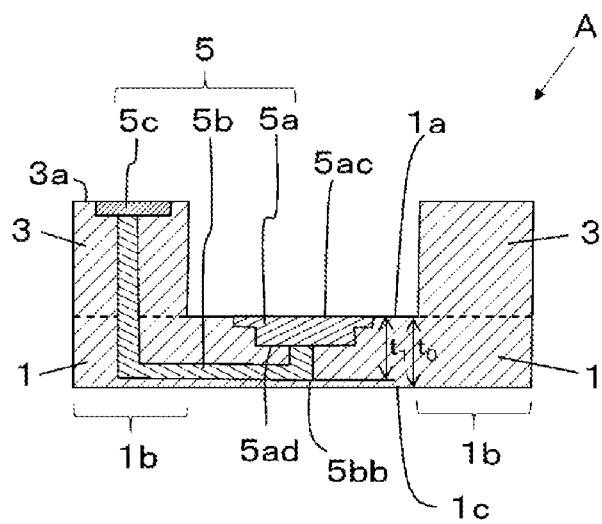
FIG. 2 is a cross-sectional view along line ii-ii of FIG. 1.

An electronic element housing package A illustrated as an example of an embodiment includes a bottom substrate 1, a bank portion 3, and a conductor part 5. The bottom substrate 1 and the bank portion 3 are an integrated object made of ceramic. The bottom substrate 1 includes a mounting portion 1$as$ for an electronic element. The mounting portion 1$as$ for an electronic element is a portion surrounded by the bank portion 3 on the bottom substrate 1. The bank portion 3 is disposed on a peripheral edge part 1$b$ of the bottom substrate 1 to surround the mounting portion 1$as$ of the bottom substrate 1. The mounting portion 1$as$ may be referred to below as a mounting surface 1$a$ when the mounting portion is flat as illustrated in FIG. 2.

The conductor part 5 includes a first conductor 5$a$, a second conductor 5$b$, and a third conductor 5$c$. A portion of the first conductor 5$a$ is exposed on the mounting surface 1$a$ of the bottom substrate 1. The first conductor 5$a$ is embedded in the bottom substrate 1. The second conductor 5$b$ is provided inside the bottom substrate 1. The second conductor 5$b$ is electrically connected to the first conductor 5$a$ inside the bottom substrate 1. The second conductor 5$b$ is disposed inside the bottom substrate 1 and extends from the bottom substrate 1 to the bank portion 3. The second conductor 5$b$ faces the height direction inside the bank portion 3. The third conductor 5$c$ is provided to be exposed on an upper surface 3$a$ of the bank portion 3. The third conductor 5$c$ is electrically connected to the second conductor 5$b$ near the upper surface 3$a$ of the bank portion 3. The second conductor 5$b$ extends from the first conductor 5$a$ along the mounting surface 1$a$ inside the bottom substrate 1.

The first conductor 5$a$ is a portion of the conductor part 5 exposed on the mounting surface 1$a$ of the bottom substrate 1. The third conductor 5$c$ is a portion of the conductor part 5 exposed on an upper surface 3$a$ of the bank portion 3. The second conductor 5$b$ is a portion of the conductor part 5 provided between the first conductor 5$a$ and the third conductor 5$c$. The second conductor 5$b$ is a portion having a width ½ or less of the width of the first conductor 5$a$ exposed on the mounting surface 1$a$ of the bottom substrate 1 when viewed from a cross-section of the bottom substrate 1. The second conductor 5$b$ is a portion having a width ½ or less of the width of the third conductor 5$c$ exposed on the upper surface 3$a$ of the bank portion 3 when viewed from a cross-section of the bank portion 3. Here, "width" refers to a length along the mounting surface 1$a$.

According to the electronic element housing package A of the present disclosure, because the conductor part 5 does not extend through the bottom substrate 1 in the thickness direction, an electronic element housing package with which moisture and gas are less likely to permeate from the bottom surface 1$c$ can be obtained even when the electronic element housing package is made smaller and thinner.

In this case, the width of the second conductor 5$b$ occupying most of the bottom substrate 1 in the thickness direction is smaller than the width of the first conductor 5$a$ in the same direction. As a result, the effect of thermal stress generated between the bottom substrate 1 and the second conductor 5$b$ can be reduced. Furthermore, an electronic element housing package with high durability even when the thickness of the bottom substrate 1 is thin can be obtained. In particular, the electronic element housing package is suitable for a case in which the bottom substrate 1 is formed of a ceramic, the second conductor 5$b$ is formed of a metal, and the bottom substrate 1 and the second conductor 5$b$ have significantly different thermal expansion coefficients and Young's moduli.

In this case, the first conductor 5$a$ and the third conductor 5$c$ function as terminal electrodes. Examples of electronic elements include electronic components such as capacitors, radio frequency filters, actuators, and inductors, semiconductor elements, and light-emitting elements. The same configuration or a configuration close to the same configuration is applied to terminal electrodes and electronic elements of electronic element housing packages B to D described below.

The conductors (first conductor 5$a$ and second conductor 5$b$) provided inside the bottom substrate 1 do not reach the bottom surface 1$c$ of the bottom substrate 1 in the electronic element housing package A. In the electronic element housing package A, the entire bottom surface 1$c$ of the bottom substrate 1 is integrally formed of a ceramic, which is the material of the bottom substrate 1. Even when the bottom substrate 1 is thin, the bottom surface 1$c$ and a portion close thereto are only formed of a ceramic, which is the material of the bottom substrate 1. In other words, there is no boundary at the portion of the bottom substrate 1 between the conductor part 5 and the bottom surface 1$c$ at which different kinds of materials such as a ceramic and a metal come in contact with each other. For this reason, it is possible to lower the possibility of moisture and gas permeating from the bottom surface 1$c$ of the bottom substrate 1.

In addition, the electronic element housing package A illustrated in FIG. 2 has a structure in which the second conductor 5$b$ extends from a lower surface 5$ad$ of the first conductor 5$a$ to the middle of the bottom substrate 1 in the thickness direction. The second conductor 5$b$ is bent inside the bottom substrate 1 close to the bottom surface 1$c$ and successively extends along the bottom surface 1$c$.

Here, in the electronic element housing package A, an interval from the position on the mounting surface 1$a$ at which the first conductor 5$a$ is exposed to the bottom surface 1$c$ is referred to as a first interval to. The first interval to corresponds to the thickness of the bottom substrate 1. In addition, an interval from the position on the mounting surface 1a at which the first conductor 5a is exposed to the position of a lower end 5bb of the second conductor 5b is referred to as a second interval $t_1$. The surface of the first conductor 5a is the surface of the bottom substrate 1, that is, the position of the mounting surface 1a. In this case, the surface of the first conductor 5a is preferably flush with the surface of the bottom substrate 1, that is, the mounting surface 1a. The second interval $t_1$ is the distance from the position of the first conductor 5a on the mounting surface 1a of the bottom substrate 1 to the position of the second conductor 5b closest to the bottom surface 1c.

In the electronic element housing package A, the second interval $t_1$ from the position on the mounting surface 1a at which the first conductor 5a is exposed to the position of the lower end 5bb of the second conductor 5b may occupy a large proportion of the first interval to from the position on the mounting surface 1a at which the first conductor 5a is exposed to the bottom surface 1c. That is, the proportion of $t_1$ to $t_0$ in the electronic element housing package A is large. With respect to the bottom substrate 1, a large proportion of $t_1$ to $t_0$ means that the first interval to corresponding to the thickness of the bottom substrate 1 is thin compared to the second interval $t_1$ corresponding to the thickness of the conductor part 5.

In the electronic element housing package A, for example, the proportion of $t_1$ to $t_0$ is preferably 0.30 or greater and 0.95 or less. When the proportion of $t_1$ to $t_0$ is 0.30 or greater and 0.95 or less, moisture and gas are not likely to permeate from the bottom surface 1c. In this case, the proportion of $t_1$ to $t_0$ is preferably 0.40 or greater and 0.90 or less, particularly 0.50 or greater and 0.80 or less. In the electronic element housing package A, even if the bottom substrate 1 includes the first conductor 5a and the second conductor 5b and the proportion of $t_1$ to $t_0$ is within the range described above, the entire bottom surface 1c of the bottom substrate 1 is still a ceramic integrated object, which is the material of the bottom substrate 1. For this reason, the electronic element housing package A can maintain high air tightness on the bottom surface 1c side of the bottom substrate 1. In this case, if porosity of the bottom substrate 1 is 1% or less, air tightness can be higher. In addition, if porosity of the bank portion 3 is 1% or less, air tightness can be higher.

Here, the porosities of the bottom substrate 1 and the bank portion 3 are determined using the Archimedes' method. Further, it may be difficult to cut out the portion of the electronic element housing package A from which the conductor part 5 is removed. Alternatively, a sample may be small. There are cases in which the Archimedes' method cannot be used to determine porosities of the bottom substrate 1 and the bank portion 3. In such a case, it is preferable to photograph cross-sections of sample pieces of the bottom substrate 1 and the bank portion 3 using a scanning electron microscope and determine the proportion of the pore area from the photographs.

The bottom substrate 1 and the bank portion 3 are preferably ceramic, and examples of ceramics include metal oxides such as alumina, mullite, silica, and forsterite, in addition to non-oxide ceramics such as aluminum nitride and silicon nitride. The use of a ceramic affords dense sintered bodies, high insulating properties, high mechanical strength, and high corrosion resistance.

If at least one type of metal selected from the group of molybdenum, tungsten, and copper is used as the material of the conductor part 5 (the first conductor 5a, the second conductor 5b, and the third conductor 5c), this metal can be fired at the same time as the above-described ceramic.

Figure 3:
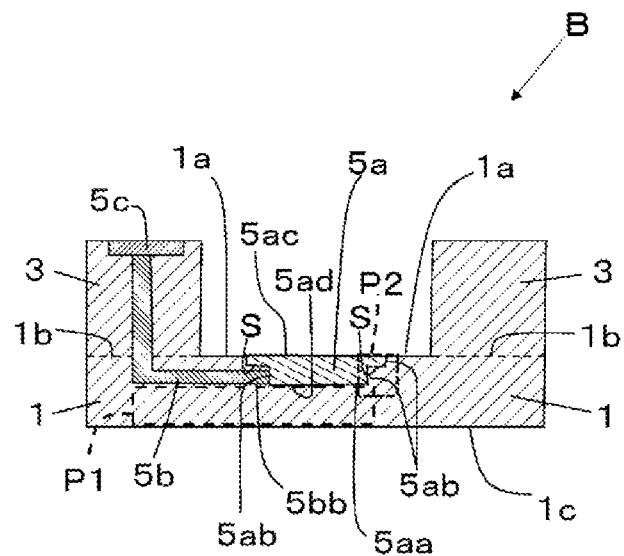
FIG. 3 is a cross-sectional view illustrating another aspect of the electronic element housing package.

FIG. 3 illustrates an electronic element housing package B. In the electronic element housing package B, the second conductor 5b extends from a side surface 5ab of the first conductor 5a. In the electronic element housing package B, the second conductor 5b is electrically connected to the side surface 5ab of the first conductor 5a. The second conductor 5b extends from the first conductor 5a along the mounting surface 1a or the bottom surface 1c. In the electronic element housing package B, there is no conductor facing the bottom substrate 1 in the thickness direction in a region P1 between the lower surface 5ad of the first conductor 5a and the bottom surface 1c. That is, in the region P1 of the bottom substrate 1, there is no structure in which a ceramic that is the material of the bottom substrate 1 and a metal that is the material of the conductor part 5 are arranged next to each other in the planar direction of the bottom surface 1c. The region P1 of the bottom substrate 1 is formed of the material of the bottom substrate 1. For this reason, the region P1 is a ceramic integrated object. Thus, moisture and gas are less likely to permeate the bottom substrate 1 from the bottom surface 1c in the electronic element housing package B as well.

In the case of the electronic element housing package B, the proportion of the conductor part 5 that occupies the bottom substrate 1 can be reduced compared to the electronic element housing package A. Under the condition that ceramic has a higher elastic modulus than metal, the electronic element housing package B is less likely to deform than the electronic element housing package A. If the elastic modulus of the bottom substrate 1 and the bank portion 3 formed of a ceramic is 400 GPa or greater, the electronic element housing package is less likely to deform.

The elastic modulus of the conductor part 5 formed of a metal is preferably 350 GPa or less. This is because the volume ratio of the portion of the ceramic having a high elastic modulus is large, and thus cracks are less likely to occur in the bottom substrate 1 even when the conductor part 5 is present inside the bottom substrate 1. As a result, high air tightness can be maintained even when the package is used for a long period of time.

As described above, in the electronic element housing package B, the second conductor 5b does not include a conductor in a portion facing the bottom substrate 1 in the thickness direction from the first conductor 5a. In addition, when the electronic element housing package B is viewed in a plan view, the electronic element housing package B has a small portion in which the second conductor 5b and the first conductor 5a appear to overlap. As a result, the wiring length of the second conductor 5b formed in the electronic element housing package B can be shortened compared to that of the second conductor 5b formed in the electronic element housing package A.

Further, in the description above, the portion of the first conductor 5a to which the second conductor 5b is electrically connected is referred to as the side surface 5ab. Here, the side surface 5ab includes not only a side surface 5ab in the direction perpendicular to the mounting surface 1a of the bottom substrate 1 but also a side surface 5ab that is inclined with respect to the mounting surface 1a. More specifically, when the mounting surface 1a is taken as a reference plane, a side surface on which the second conductor 5b is connected to the first conductor 5a having an orientation at an angle of 45° or less from the reference plane is included. This means that, in the structure of FIG. 3, while the angle formed by the orientation of the surface on which the second conductor 5b is connected to the first conductor 5a and the mounting surface 1a is a right angle or an angle close to a right angle, the angle formed by the orientation and the mounting surface 1a may be 45 degrees or smaller.

In addition, in the electronic element housing package B, the first conductor 5a may have a protruding shape with a step S in the thickness direction, as illustrated in FIG. 3. Both the surface of the first conductor 5a on the mounting surface 1a side (referred to as an upper surface 5ac) and the surface of the first conductor 5a at a lower end 5aa (referred to as the lower surface 5ad) are flat surfaces along the mounting surface 1a or the bottom surface 1c. In other words, the upper surface 5ac and the lower surface 5ad of the first conductor 5a are substantially parallel. In a case where the first conductor 5a has a cross-sectional structure such as that illustrated in FIG. 3, the upper surface 5ac and the lower surface 5ad of the first conductor 5a have different areas. In this case, in the first conductor 5a, the area of the upper surface Sac is larger than the area of the lower surface 5ad with the step S serving as the boundary. In other words, in the first conductor 5a, the area of the lower surface 5ad is smaller than the area of the upper surface Sac with the step S serving as the boundary. In other words, the volume of the first conductor 5a on the bottom surface 1c side is smaller than the volume thereof on the mounting surface 1a side with the step S serving as the boundary. Thus, the proportion of ceramic of the bottom substrate 1 on the bottom surface 1c side increases. The bottom substrate 1 is less likely to deform when ceramic being the material of the bottom substrate 1 has a higher elastic modulus than that of metal being the material of the first conductor 5a. This makes it possible to obtain the electronic element housing package B capable of maintaining even higher air tightness over long term use.

Figure 4:
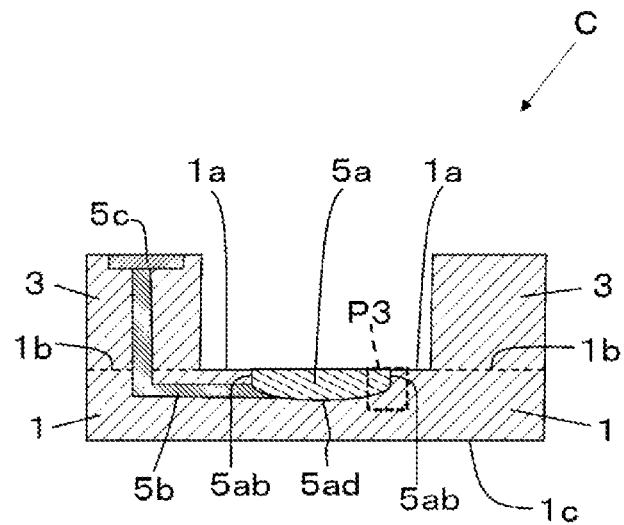
FIG. 4 is a cross-sectional view illustrating another aspect of the electronic element housing package.

FIG. 4 illustrates an electronic element housing package C. The electronic element housing package C has a shape in which the first conductor 5a is convexly curved toward the bottom surface 1c side. Further, the entire first conductor 5a may be convexly curved toward the bottom surface 1c side. Alternatively, a portion of the first conductor 5a may be convexly curved toward the bottom surface 1c side. In FIG. 4, the lower surface 5ad is curved. The curvature radius of the lower surface 5ad may be 300 μm or greater and 4000 μm or less. Thus, defects such as cracks are less likely to occur in the electronic element housing package C, compared to the electronic element housing package A and the electronic element housing package B. As a result, the electronic element housing package C has high heat and shock resistance in addition to air tightness.

Figure 5:
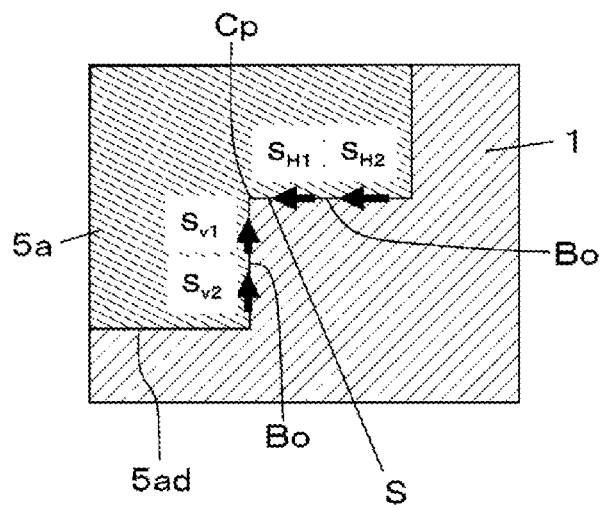
FIG. 5 is an enlarged view of the portion P2 in FIG. 3 and is a schematic view illustrating stress generated at the portion P2.
Figure 6:
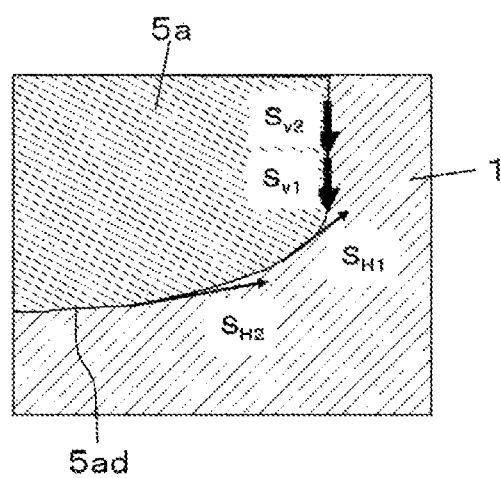
FIG. 6 is an enlarged view of the portion P3 in FIG. 4 and is a schematic view illustrating stress generated at the portion P3.

The reason that the electronic element housing package C has higher heat and shock resistance compared to the electronic element housing package A and the electronic element housing package B is as follows. FIG. 5 is an enlarged view of the portion P2 in FIG. 3 and is a schematic view illustrating stress generated at the portion P2. FIG. 6 is an enlarged view of the portion P3 in FIG. 4 and is a schematic view illustrating stress generated at the portion P3. The electronic element housing package A and the electronic element housing package B are different from the electronic element housing package C in the shape of the lower surface 5ad of the first conductor 5a. In the case of the electronic element housing package A and the electronic element housing package B in which the first conductor 5a includes the step S, the first conductor 5a includes a corner Cp at the portion of the step S. The bottom substrate 1 formed with ceramic as the main material and the first conductor 5a formed with metal as the main material have different main components. As a result, the bottom substrate 1 and the first conductor 5a have different Young's moduli and thermal expansion coefficients. In such a case, due to the difference in Young's moduli and thermal expansion coefficients of the materials of the bottom substrate 1 and the first conductor 5a, horizontal stresses ($S_{H1}$, $S_{H2}$) and vertical stresses ($S_{V1}$, $S_{V2}$) are likely to occur at a boundary vicinity Bo between the first conductor 5a and the bottom substrate 1. When the shape of the lower surface 5ad of the first conductor 5a is a protruding shape and the corner Cp as illustrated in FIG. 5 is formed between the bottom substrate 1 and the first conductor 5a, both the horizontal stresses ($S_{H1}$, $S_{H2}$) and the vertical stresses ($S_{V1}$, $S_{V2}$) are directed toward the corner Cp. As a result, the stresses ($S_{H1}$, $S_{H2}$, $S_{V1}$, $S_{V2}$) are concentrated on the corner Cp.

In the case of the electronic element housing package C, the shape of the lower surface 5ad of the first conductor 5a is a convexly curved shape as illustrated in FIG. 6. Thus, no corner Cp is present on the lower surface 5ad of the first conductor 5a. In a case in which the shape of the first conductor 5a is the shape illustrated in FIGS. 4 and 6, the vertical stresses ($S_{V1}$, $S_{V2}$) act in aligned directions as illustrated in FIG. 6. The angle that the two horizontal stresses ($S_{H1}$, $S_{H2}$) act toward on the lower surface 5ad of the first conductor 5a shifts. Because the angle that the two horizontal stresses ($S_{H1}$, $S_{H2}$) act toward shifts, the horizontal stresses are unlikely to become concentrated with the vertical stresses ($S_{V1}$, $S_{V2}$) Thus, defects such as cracks and the like are less likely to occur in the electronic element housing package C, compared to the electronic element housing package A and the electronic element housing package B. As a result, the electronic element housing package C has high heat and shock resistance in addition to air tightness.

Figure 7:
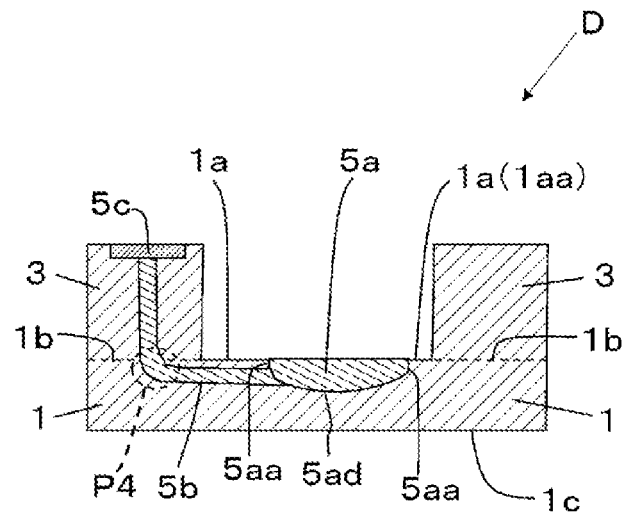
FIG. 7 is a cross-sectional view illustrating another aspect of the electronic element housing package.

FIG. 7 illustrates an electronic element housing package D. The electronic element housing package D includes the second conductor 5b with a portion P4 having a curved shape from the bottom substrate 1 to the bank portion 3. In this configuration, the curvature radius of the portion P4 is preferably 30 μm or greater and 200 μm or less.

In the electronic element housing package D, in addition to the lower surface 5ad of the first conductor 5a having a convexly curved shape, the second conductor 5b also has a partially curved shape. In the case of the electronic element housing package D, concentration of stress generated between the bottom substrate 1 and the first conductor 5a can be reduced. In addition to this, stress concentrating at the portion P4 of the second conductor 5b from the bottom substrate 1 to the bank portion 3 can be curbed. As a result, the electronic element housing package D has even higher heat and shock resistance. In addition, in a case in which the portion P4 of the second conductor 5b from the bottom substrate 1 to the bank portion 3 has a curved shape, it is possible to obtain an electronic apparatus with small reflection characteristics with respect to a high frequency current. In this case, the second conductor 5b preferably has an elongated shape.

Figure 8:
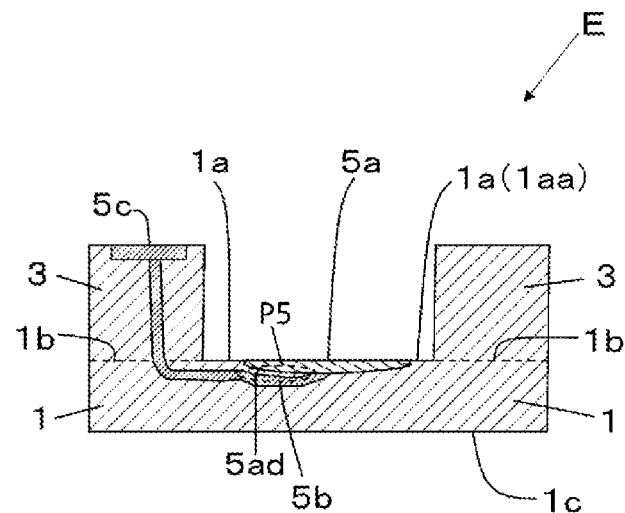
FIG. 8 is a cross-sectional view illustrating another aspect of the electronic element housing package.

FIG. 8 illustrates an electronic element housing package E. A portion P5 of the electronic element housing package E illustrated in FIG. 8 is different from that of the electronic element housing package D. In the electronic element housing package E, the lower surface 5ad of the first conductor 5a has a convexly curved shape. The second conductor 5b has a structure in which the second conductor 5b is electrically connected to the lower surface 5ad of the first conductor 5a at a central region of the lower surface 5ad. The second conductor 5b is disposed in the lower surface 5ad of the first conductor 5a with a substantially constant interval between the lower surface 5ad of the first conductor 5a and the second conductor 5b. The interval between the first conductor 5a and the second conductor 5b is equal to or close to the longitudinal direction of the second conductor 5b, and thus, it is possible to form an LC circuit that can enhance noise removal.

Figure 9:
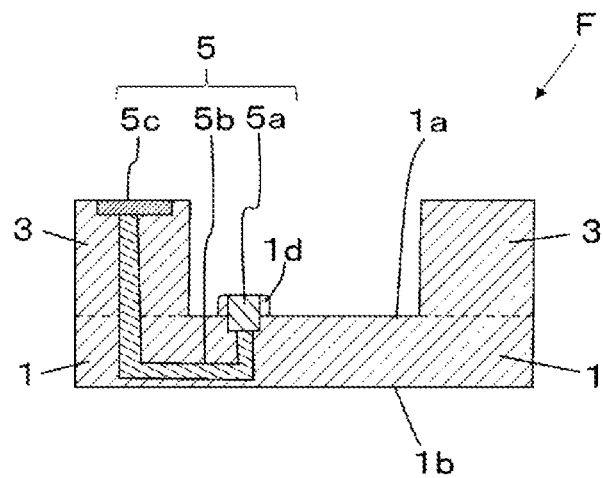
FIG. 9 is a cross-sectional view illustrating another aspect of the electronic element housing package.

FIG. 9 illustrates an electronic element housing package F. The electronic element housing package according to the present disclosure includes not only a structure in which the mounting portion 1as is flat as described above but also the structure illustrated in FIG. 9. In the electronic element housing package F, the first conductor 5a includes a portion embedded in the bottom substrate 1 and a portion protruding from a surface of the mounting portion 1as. In other words, the electronic element housing package F includes a protruding portion 1d having the first conductor 5a on the mounting surface 1a. In this case, the volume of the embedded portion of the first conductor 5a is preferably smaller than the volume of the portion protruding above the mounting surface 1a. In addition, the width of the first conductor 5a is preferably greater than the width of the second conductor 5b. Here, the width of the first conductor 5a and the width of the second conductor 5b refer to a length along the mounting surface 1a when the electronic element housing package F is viewed from a cross-section, as illustrated in FIG. 9. When the first conductor 5a and the second conductor 5b are viewed in terms of proportion of length to the bottom substrate 1 in the thickness direction, the proportion of the length of the second conductor 5b to the thickness of the bottom substrate 1 is greater than that of the first conductor 5a. In this case, the width of the second conductor 5b occupying the majority of the bottom substrate 1 in the thickness direction is smaller than the width of the first conductor 5a in the same direction. When the bottom substrate 1 is formed of a ceramic and the second conductor 5b is formed of a metal, the bottom substrate 1 and the second conductor 5b have greatly different thermal expansion coefficients and Young's moduli. Even in such a state, the effect of thermal stress generated between the bottom substrate 1 and the second conductor 5b can be reduced. Furthermore, it is possible to obtain the electronic element housing package F with high durability even when the bottom substrate 1 is thin.

Furthermore, in the electronic element housing package F, the first conductor 5a is embedded in both the protruding portion 1d and the bottom substrate 1 with the mounting surface 1a serving as a boundary. In this case, the first conductor 5a is surrounded not only by the protruding portion 1d but also by the bottom substrate 1. The connection reliability between the first conductor 5a and the second conductor 5b can be increased as compared to the case in which the boundary between the first conductor 5a and the second conductor 5b is the mounting surface 1a.

A crystal oscillator, for example, is mounted as an electronic element on the protruding portion 1d of the electronic element housing package F. In this case as well, moisture and gas are not likely to permeate from the bottom surface 1c of the bottom substrate 1.

Although the second conductor 5b has a shape in which the second conductor is bent at a substantially right angle in the bottom substrate 1 on the lower side of the mounting portion 1as and the bank portion 3 in the electronic element housing package F illustrated in FIG. 9, the present disclosure is not applied to only a structure in which the second conductor 5b is bent at a right angle in this manner. The shape in which the second conductor 5b is bent at a substantially right angle inside the bottom substrate 1 on the lower side of the mounting portion 1as and the bank portion 3 can be applied to the various electronic element housing packages B, C, and D illustrated in FIGS. 3, 4, and 7.

Figure 10:
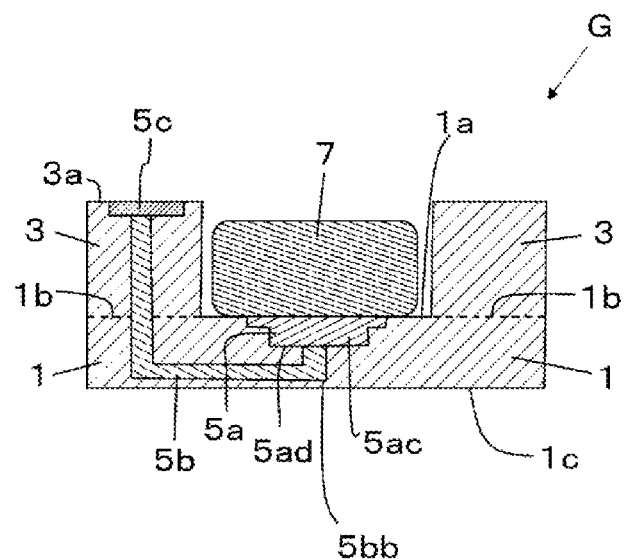
FIG. 10 is a cross-sectional view of an electronic apparatus illustrated as an example of an embodiment.
Figure 11:
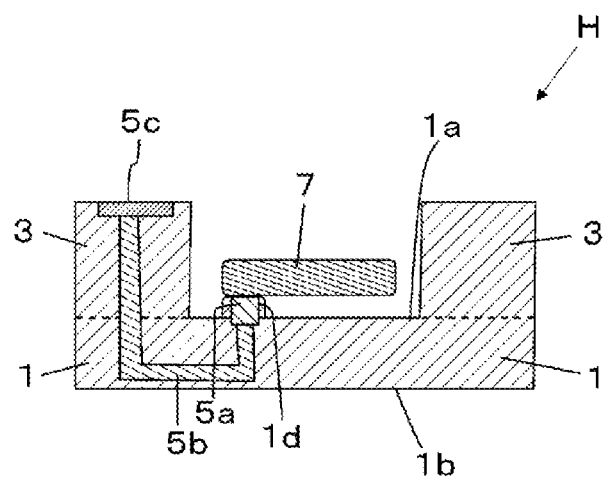
FIG. 11 is a cross-sectional view of an electronic apparatus as another aspect of the embodiment.

FIG. 10 is a cross-sectional view of an electronic apparatus G illustrated as an example of an embodiment. The electronic apparatus G illustrated in FIG. 10 has a configuration in which an electronic element 7 is mounted on the mounting portion 1as of the electronic element housing package A illustrated in FIG. 2. Examples of the electronic element 7 of this case may include an electronic component, commonly called a passive component, such as a capacitor, a piezoelectric actuator, or an inductor. FIG. 11 is a cross-sectional view of an electronic apparatus H as another aspect of the embodiment. The electronic apparatus H illustrated in FIG. 11 has a configuration in which an electronic element 7 is mounted on the mounting portion 1as of the electronic element housing package F illustrated in FIG. 9. An example of the electronic element 7 of this case may include a crystal oscillator. With the electronic apparatus G and the electronic apparatus H, even when the electronic apparatuses become smaller and thinner, moisture and gas are less likely to permeate from the bottom surface 1c, and therefore, high reliability can be achieved. Further, FIGS. 10 and 11 illustrate examples of the electronic element housing packages A and F. The electronic apparatuses G and H of the embodiment can also be applied to the electronic element housing packages B, C, D, and E described above.

Figure 12:
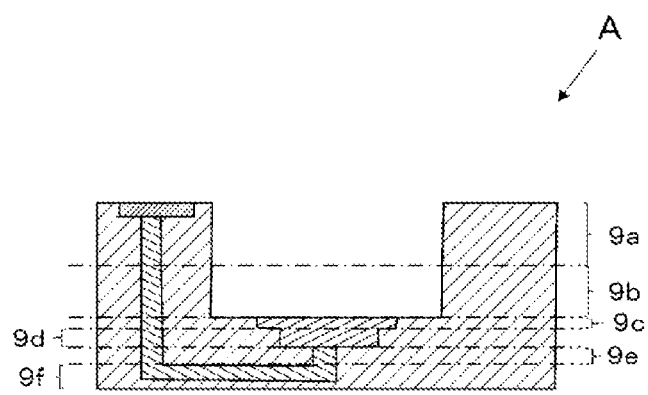
FIG. 12 is a schematic cross-sectional view illustrating placement when patterned sheets illustrated in FIGS. 13 and 14 are used in the manufacturing of an electronic element housing package A illustrated in FIG. 2.
Figure 13:
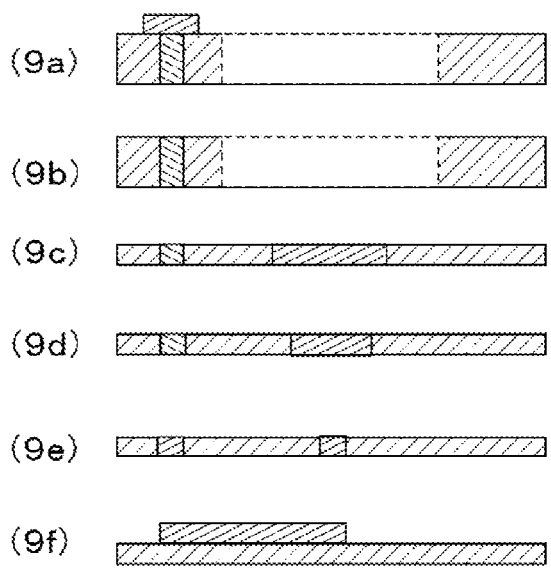
FIG. 13 is a schematic cross-sectional view illustrating the patterned sheets used for manufacturing the electronic element housing package A.
Figure 14:
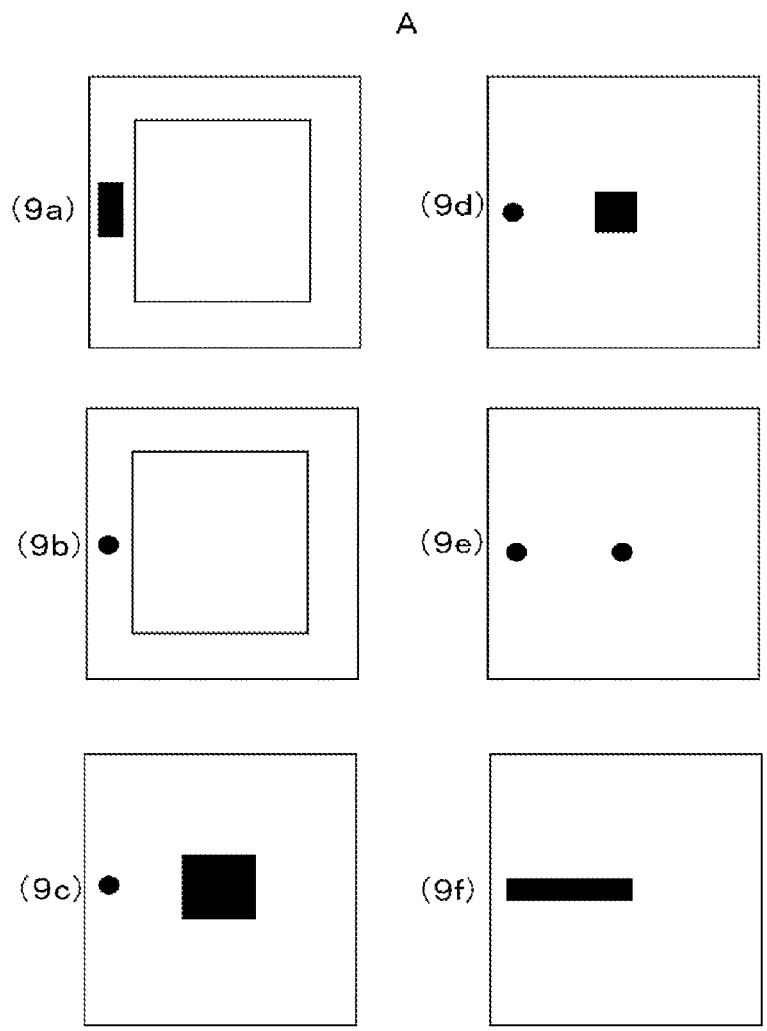
FIG. 14 is a schematic plan view illustrating the patterned sheets used for manufacturing the electronic element housing package A.

Next, the present applicant will describe manufacturing methods of each of the electronic element housing packages A to F of the present disclosure. FIG. 12 is a schematic cross-sectional view illustrating placement when patterned sheets illustrated in FIGS. 13 and 14 are used in the manufacturing of the electronic element housing package A illustrated in FIG. 2. FIG. 13 is a schematic cross-sectional view illustrating the patterned sheets used for manufacturing the electronic element housing package A. FIG. 14 is a schematic plan view illustrating the patterned sheets used for manufacturing the electronic element housing package A. The electronic element housing package A illustrated in FIG. 2 can be obtained according to the following procedure. First, the patterned sheets illustrated in FIGS. 12 to 14 are prepared. These patterned sheets are overlaid and pressed at a predetermined pressure to produce a laminate. Next, the produced laminate is fired under predetermined conditions. A plating film of at least one type selected from the group of nickel, gold, and tin is formed as necessary for the conductor part 5 that is exposed on the bottom substrate 1 and the bank portion 3. Each patterned sheet is obtained by forming a conductor pattern on a ceramic green sheet. In addition, through holes are formed on the ceramic green sheet serving as the patterned sheet as necessary. The through holes are filled with a conductor paste. The through holes serve as via conductors.

The ceramic green sheet is obtained by sheet-molding a slurry obtained by dispersing a ceramic powder in an organic vehicle. The organic vehicle is a liquid in which an organic resin is dissolved in an organic solvent. A raw material powder of the ceramic described above is the ceramic powder of the ceramic green sheet. Examples of the ceramic raw material powder include metal oxides such as alumina, mullite, silica, and forsterite, as well as non-oxide ceramics such as aluminum nitride and silicon nitride. The conductor pattern and via conductors are formed using a conductor paste prepared by mixing the metal powder with the organic vehicle described above. The conductor pattern and the via conductors are formed using screen printing, for example.

Figure 15:
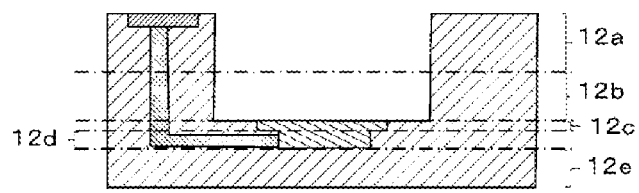
FIG. 15 is a schematic cross-sectional view illustrating placement when patterned sheets illustrated in FIGS. 16 and 17 are used in the manufacturing of an electronic element housing package B illustrated in FIG. 3.
Figure 16:
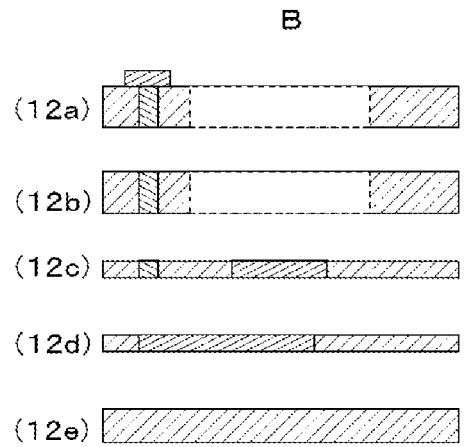
FIG. 16 is a schematic cross-sectional view illustrating the patterned sheets used for manufacturing the electronic element housing package B.
Figure 17:
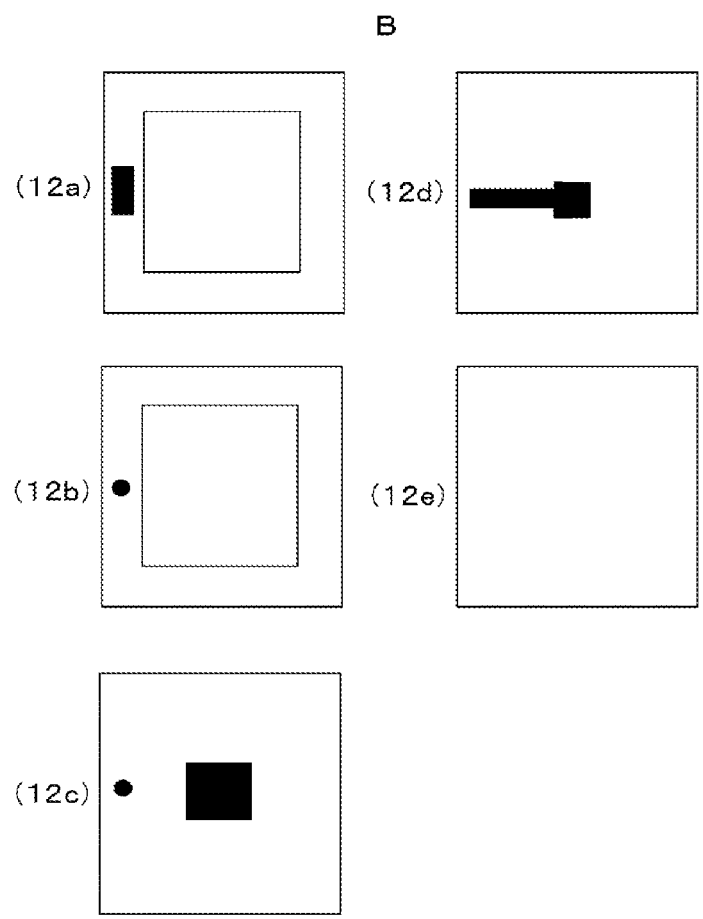
FIG. 17 is a schematic plan view illustrating the patterned sheets used for manufacturing the electronic element housing package B.

FIG. 15 is a schematic cross-sectional view illustrating placement when patterned sheets illustrated in FIGS. 16 and 17 are used in the manufacturing of the electronic element housing package B illustrated in FIG. 3. FIG. 16 is a schematic cross-sectional view illustrating the patterned sheets used for manufacturing the electronic element housing package B. FIG. 17 is a schematic plan view illustrating the patterned sheets used for manufacturing the electronic element housing package B. The electronic element housing package B illustrated in FIG. 3 can be obtained according to the following procedure. First, the patterned sheets illustrated in FIGS. 15 to 17 are prepared. Next, these patterned sheets are overlaid and pressed at a predetermined pressure to form a laminate. Next, the produced laminate is then fired under predetermined conditions. In this case, conditions of the ceramic green sheet, the conductor pattern, the via conductors, and the plating film for making the laminate, as well as pressurizing conditions and firing conditions when producing the laminate may be the same conditions as those used when manufacturing the electronic element housing package A. Alternatively, conditions may be changed in a range in which the structure and characteristics of the electronic element housing package B are not impaired.

Figure 18:
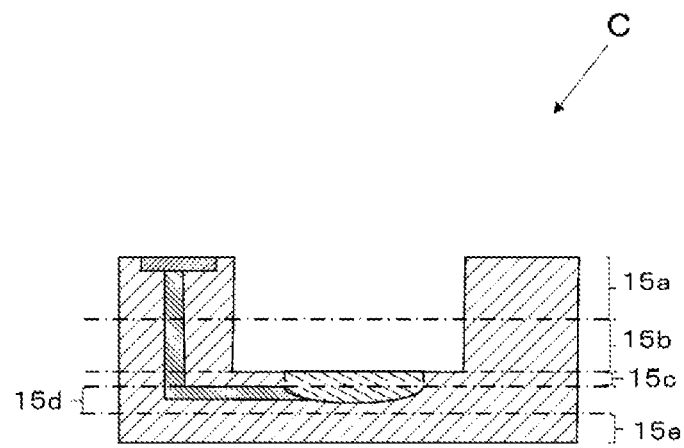
FIG. 18 is a schematic cross-sectional view illustrating placement when patterned sheets illustrated in FIGS. 19 and 20 are used in the manufacturing of an electronic element housing package C illustrated in FIG. 4.
Figure 19:
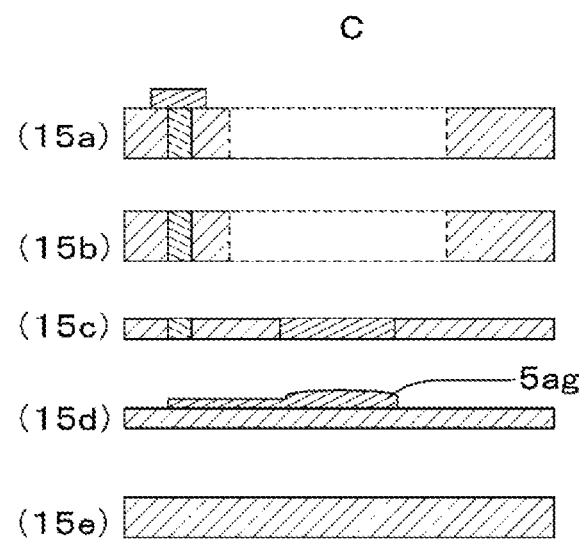
FIG. 19 is a schematic cross-sectional view illustrating the patterned sheets used for manufacturing the electronic element housing package C.
Figure 20:
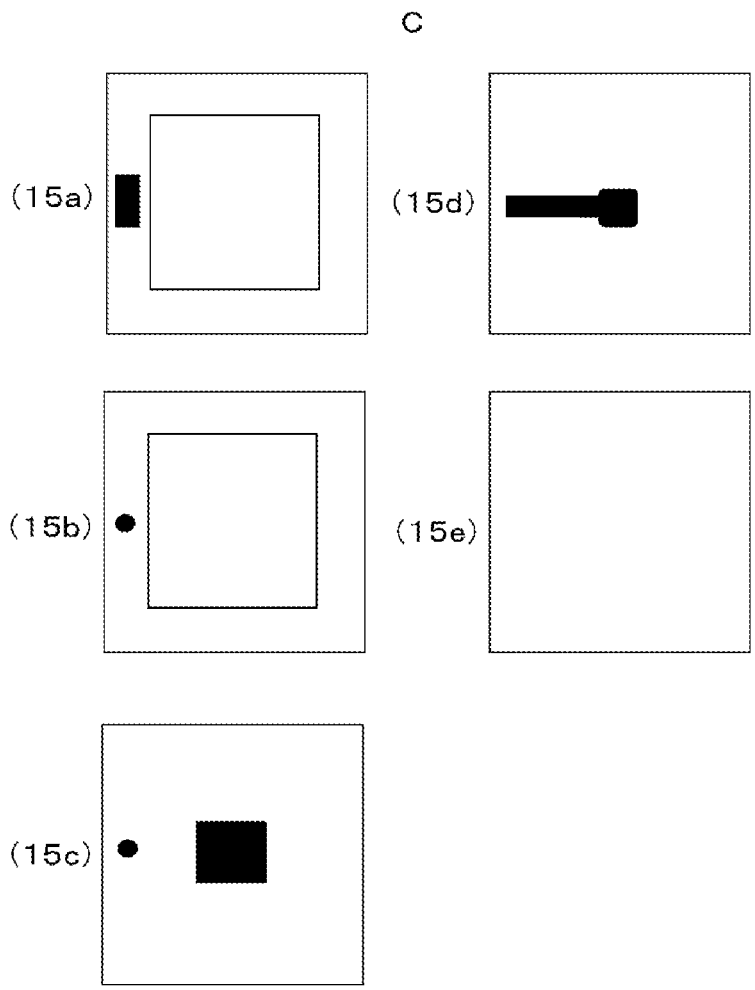
FIG. 20 is a schematic plan view illustrating the patterned sheets used for manufacturing the electronic element housing package C.

FIG. 18 is a schematic cross-sectional view illustrating placement when patterned sheets illustrated in FIGS. 19 and 20 are used in the manufacturing of the electronic element housing package C illustrated in FIG. 4. FIG. 19 is a schematic cross-sectional view illustrating the patterned sheets used for manufacturing the electronic element housing package C. FIG. 20 is a schematic plan view illustrating the patterned sheets used for manufacturing the electronic element housing package C. The electronic element housing package C illustrated in FIG. 4 can be obtained according to the following procedure. First, the patterned sheets illustrated in FIGS. 18 to 20 are prepared. Next, these patterned sheets are overlaid and pressed at a predetermined pressure to form a laminate. Next, the produced laminate is then fired under predetermined conditions. The same conditions as those used when manufacturing the electronic element housing package A may be used as pressure conditions and firing conditions for producing the ceramic green sheet, the conductor pattern, the via conductors, the plating film, and the laminate for producing the laminate. Alternatively, conditions may be changed in a range in which the structure and characteristics of the electronic element housing package B are not impaired.

In the electronic element housing package C, a first conductor 5a in which the lower surface 5ad has a convexly curved shape may be formed. In such a case, like the conductor pattern shown in the patterned sheet 15d illustrated in FIG. 19, a conductor pattern portion 5ag of the portion serving as the first conductor 5a formed on the ceramic green sheet is preferably formed to have a curved surface in advance. Next, the produced patterned sheet 15d can be pressurized and heated together with other patterned sheets as illustrated in FIG. 19. When the patterned sheets 15a to 15e are pressurized and heated, the conductor pattern portion 5ag formed on the patterned sheet 15d has a downward convex shape with a curved surface.

Figure 21:
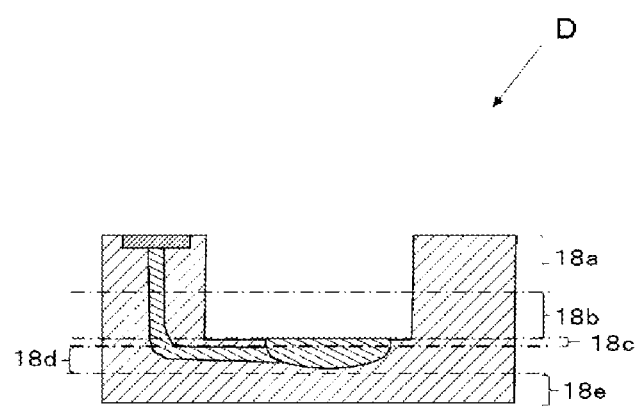
FIG. 21 is a schematic cross-sectional view illustrating placement when patterned sheets illustrated in FIGS. 22 and 23 are used in the manufacturing of an electronic element housing package D illustrated in FIG. 7.
Figure 22:
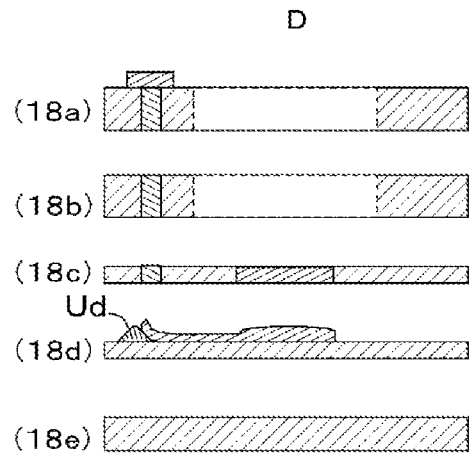
FIG. 22 is a schematic cross-sectional view illustrating the patterned sheets used for manufacturing the electronic element housing package D.
Figure 23:
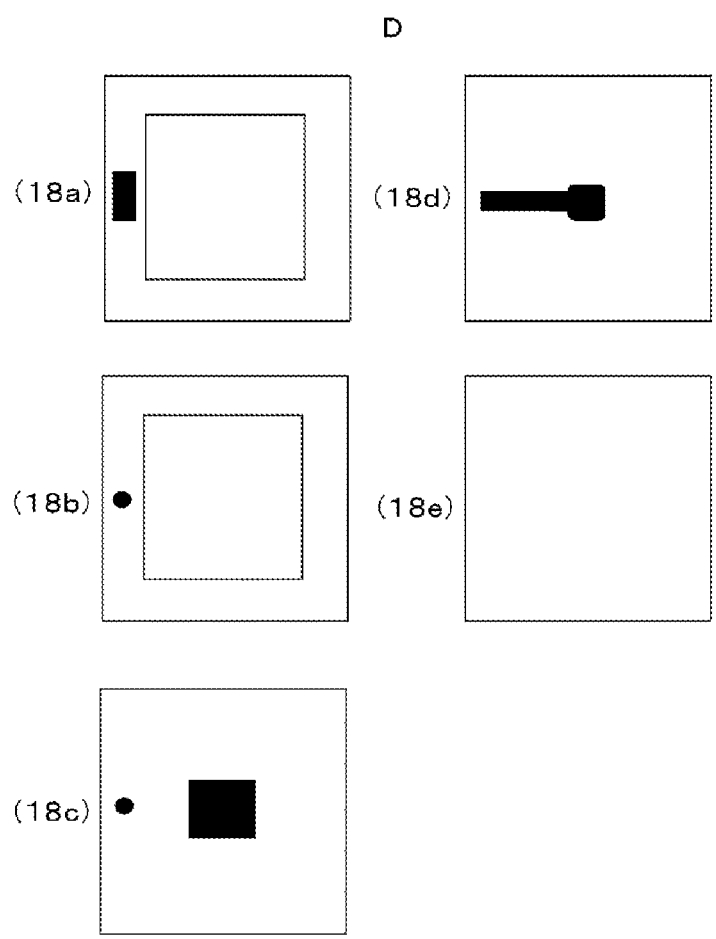
FIG. 23 is a schematic plan view illustrating the patterned sheets used for manufacturing the electronic element housing package D.

FIG. 21 is a schematic cross-sectional view illustrating placement when patterned sheets illustrated in FIGS. 22 and 23 are used in the manufacturing of the electronic element housing package D illustrated in FIG. 7. FIG. 22 is a schematic cross-sectional view illustrating the patterned sheets used for manufacturing the electronic element housing package D. FIG. 23 is a schematic plan view illustrating the patterned sheets used for manufacturing the electronic element housing package D. The electronic element housing package D illustrated in FIG. 7 can be obtained according to the following procedure. First, the patterned sheets illustrated in FIGS. 22 and 23 are prepared. Next, these patterned sheets are overlaid and pressed at a predetermined pressure to produce a laminate. Next, the produced laminate is then fired under predetermined conditions. The same conditions as in the case of the electronic element housing package A are used for producing the ceramic green sheet, conductor pattern, via conductors, plating film, and for pressurizing and firing to produce the laminate. In the electronic element housing package D, the first conductor 5a in which the lower surface 5ad has a convexly curved shape is formed using the same method as the above-described electronic element housing package C. The patterned sheet 18d illustrated in FIG. 22 is used to form the second conductor 5b having a curved portion extending from the bottom substrate 1 to the bank portion 3. The curved portion of the second conductor 5b may be referred to as a curved portion. First, a ceramic paste is used to form an uplifted portion Ud on the ceramic green sheet in the portion corresponding to the curved portion of the second conductor 5b in the patterned sheet 18d. A conductor pattern is then formed on the upper side of the uplifted portion Ud. The ceramic paste preferably includes the same ceramic powder as the ceramic green sheet.

Examples

Figure 24:
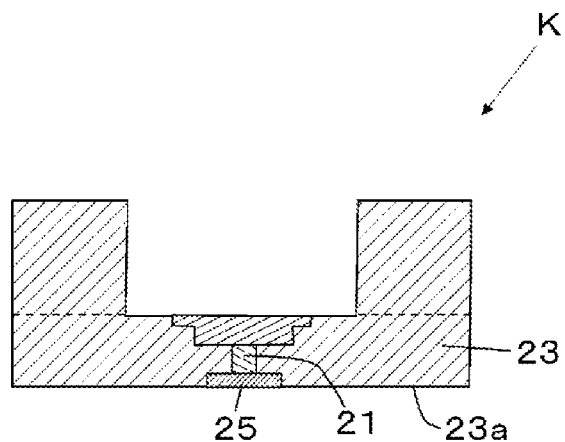
FIG. 24 is a schematic cross-sectional view of an electronic element housing package including a conductor extending through a bottom substrate in a thickness direction.
Figure 25:
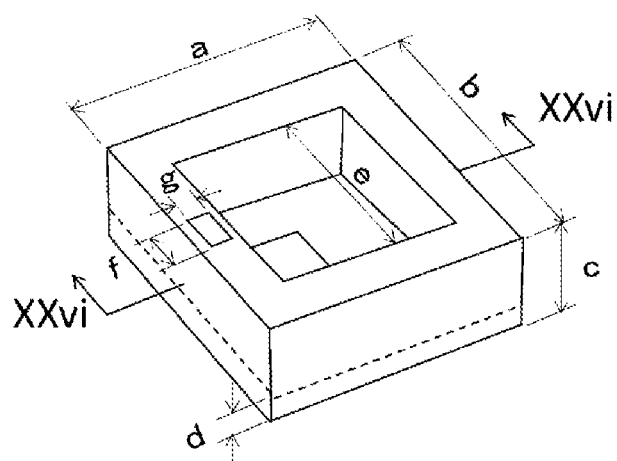
FIG. 25 is a perspective view illustrating the shape and dimensions of a manufactured sample of the electronic element housing package.
Figure 26:
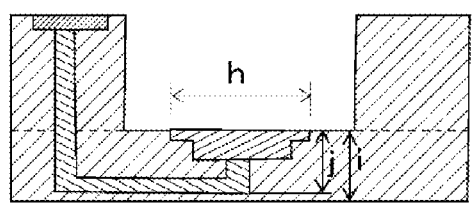
FIG. 26 is a cross-sectional view illustrating the shape and dimensions of a cross-section along line XXvi-XXvi of FIG. 25.
Figure 27:
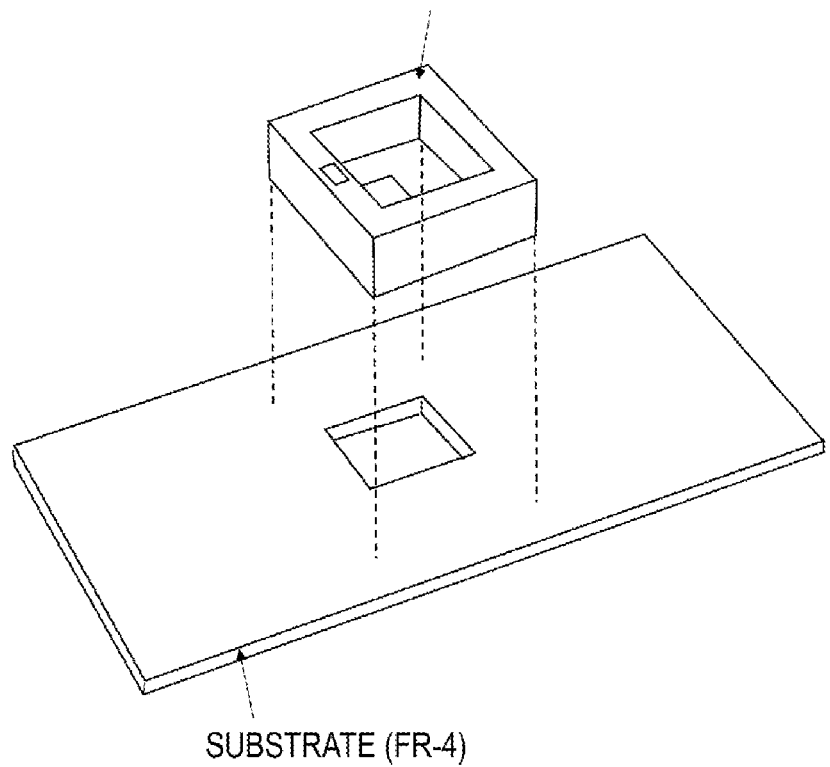
FIG. 27 is an exploded perspective view of a sample used for performing a deflection test on the electronic element housing package.
Figure 28:
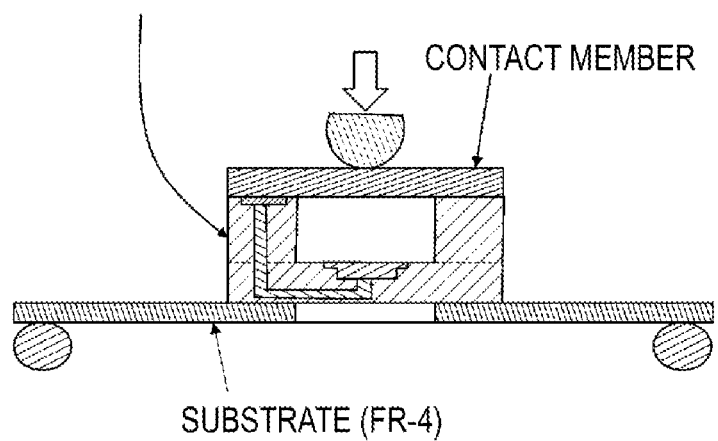
FIG. 28 is a cross-sectional view illustrating a state in which a deflection test is performed on the electronic element housing package.

FIG. 24 is a schematic cross-sectional view of an electronic element housing package (K) including a conductor extending through a bottom substrate in a thickness direction. FIG. 25 is a perspective view illustrating the shape and dimensions of a manufactured sample of the electronic element housing package. FIG. 26 is a cross-sectional view illustrating the shape and dimensions of a cross-section along line XXvi-XXvi of FIG. 25. FIG. 27 is an exploded perspective view of a sample used for performing a deflection test on the electronic element housing package. FIG. 28 is a cross-sectional view illustrating a state in which a deflection test is performed on the electronic element housing package. The electronic element housing package was produced using the method illustrated in FIGS. 12 to 23. Furthermore, the electronic element housing package K in which a conductor 21 corresponding to the second conductor faces the direction of a bottom surface 23a of a bottom substrate 23 and is connected to a third conductor 25 provided on the bottom surface 23a of the bottom substrate 23 was produced as illustrated in FIG. 24.

The ceramic green sheet was produced by sheet-molding a slurry having alumina powder and an organic vehicle. The organic vehicle is a mixture of a polyvinyl butyral-based organic resin and toluene. For a conductor paste, a paste prepared by mixing molybdenum powder and a polyvinyl alcohol resin was used. Firing conditions of the laminate including a maximum temperature of 1550° C. and a retention time at the maximum temperature of 2 hours in a reducing atmosphere using a nitrogen-hydrogen mixed gas were set. The shape and size of the obtained sample of the electronic element housing package are illustrated in FIGS. 25 and 26. The porosities of both of the bottom substrate and the bank portion of the obtained sample of the electronic element housing package were 0.9%. Although FIGS. 25 and 26 illustrate the electronic element housing package A as an example, the electronic element housing packages B to D were produced to have the same dimensions of a to j.

The dimensions excluding i and j were applied to the electronic element housing package K illustrated in FIG. 24, which was produced to be compared to the above packages.

The dimensions of the reference signs in FIGS. 25 and 26 are as follows. a=b=2.0 mm, c=0.26 mm, d=i=0.1 mm, e=1.6 mm, f=0.2 mm, g=0.1 mm, h=0.6 mm, j=0.08 mm. Further, the dimension of j in the electronic element housing packages B, C, and D was 0.04 mm.

A deflection test was performed by mounting a produced electronic element housing package on an FR-4 substrate using an adhesive and pressurizing the substrate by bending three points. For the FR-4 substrate, a substrate with a structure in which a portion corresponding to the mounting surface of the electronic element housing package is open was used. A silicon nitride ceramic was installed as a contact member of the pressurizing jig on the electronic element housing package. The deflection test was performed using AUTOGRAPH. The amount of deflection was set to 0.05 mm, 0.1 mm, and 0.15 mm on the scale of the AUTOGRAPH. When a load was applied to the sample, a method in which the sample is held for 10 seconds at each deflection amount and then the load is released was employed. The sample subjected to the deflection test was then immersed in a solution (red check liquid) containing a permeation/flaw detecting agent. At the portion at which the FR-4 substrate was open, the electronic element housing package was in a state in which no adhesive was attached, and permeation of the permeation/flaw detecting agent from that portion was evaluated. A cross-section of the sample immersed in the solution (red check liquid) containing the permeation/flaw detecting agent was observed using a digital microscope to evaluate the presence or absence of the permeation of the permeation/flaw detecting agent. A sample in which the permeation/flaw detecting agent did not reach the portion of the second conductor or via conductor even after being immersed in the solution (red check liquid) containing the permeation/flaw detecting agent was evaluated as favorable (◯). A sample in which the permeation/flaw detecting agent reached the portion of the second conductor or via conductor after being immersed in the solution (red check liquid) containing the permeation/flaw detecting agent was evaluated as poor (X). The number of samples was set to five for each of the electronic element housing packages. Five of the same samples (e.g., those of the electronic element housing package A) exhibited the same state of permeation of the permeation/flaw detecting agent after the deflection test.

TABLE 1

| FIG. | ELECTRONIC ELEMENT HOUSING PACKAGE | DEFLECTION AMOUNT (mm) | | |
|---|---|---|---|---|
| | | 0.05 | 0.1 | 0.15 |
| 2 | A | ◯ | X | X |
| 3 | B | ◯ | ◯ | X |
| 4 | C | ◯ | ◯ | ◯ |
| 7 | D | ◯ | ◯ | ◯ |
| 24 | K | X | X | X |

As is clear from the results shown in Table 1, permeation of the permeation/flaw detecting agent was observed in the electronic element housing package K produced as a reference example under the condition of the amount of deflection being 0.05 mm.

On the other hand, permeation of the permeation/flaw detecting agent was not observed in the electronic element housing packages A, B, C, and D even under the condition of the amount of deflection being 0.05 mm. Permeation of the permeation/flaw detecting agent was not observed in the electronic element housing packages B, C, and D even under the condition of the amount of deflection being 0.1 mm. Permeation of the permeation/flaw detecting agent was not observed in the electronic element housing packages C, and D even under the condition of the amount of deflection being 0.15 mm. It was found that the electronic element housing packages A, B, C, and D had varying degrees of resistance against the amounts of deflection imparted to the electronic element housing packages depending on differences in the disposition and shape of the second conductor.

Figure 29:
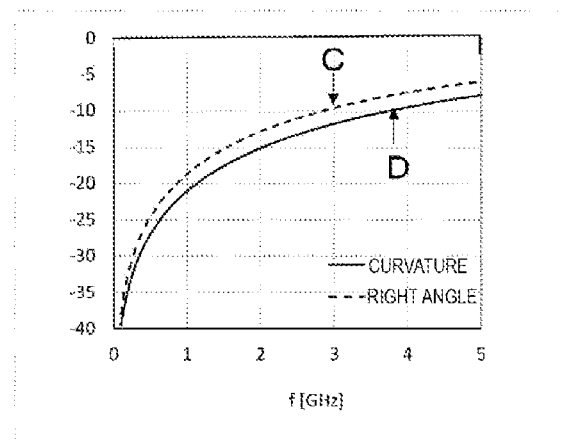
FIG. 29 shows the results of electromagnetic field analysis at a portion P4 of a second conductor.

FIG. 29 is the results of electromagnetic field analysis at a portion P4 of the second conductor constituting the electronic element housing package D illustrated in FIG. 7. The results were compared to those of the electronic element housing package C, in which the second conductor has a right angle in a region extending from the bottom substrate to the bank portion. In this electromagnetic field analysis, the following parameters were used. The relative permittivity of the material of the bottom substrate and the bank portion was 9.2. The dissipation factor was 0.0006. These values were the relative permittivity and dissipation factor at 10 GHz of the material used. The conductivity of the conductor (wiring) was set to 1.75 (S/m). The width of the conductor (wiring) was set to 0.1 mm and the thickness was 0.015 mm. The curvature radius at in the portion P4 of the second conductor was set to 72 μm. As shown in FIG. 29, it was found that the electronic element housing package D with the structure in which the second conductor is curved in the region extending from the bottom substrate to the bank portion had improved return loss characteristics compared to the electronic element housing package C with the structure in which the second conductor has a right angle at the region extending from the bottom substrate to the bank portion. As shown in FIG. 29, the electronic element housing package C had a frequency of 3 GHz at −10 dB of S11. The electronic element housing package D had a frequency of 4 GHz at −10 dB of S11.

It is possible for a person(s) skilled in the art to readily derive an additional effect(s) and/or variation(s). Hence, a broader aspect(s) of the present invention is/are not limited to a specific detail(s) and a representative embodiment(s) as illustrated and described above. Therefore, various modifications are possible without departing from the spirit or scope of a general inventive concept that is defined by the appended claim(s) and an equivalent(s) thereof.

REFERENCE SIGNS LIST

A, B, C, D, E, F Electronic element housing package
G, H Electronic apparatus
1 Bottom substrate
1a Mounting surface
1as Mounting portion
1b Peripheral edge part
1c Bottom surface
3 Bank portion
3a Upper surface
5 Conductor part
5a First conductor
5ab Side surface of first conductor
5ac Upper surface of first conductor
5ad Lower surface of first conductor
5b Second conductor
5bb Lower end of second conductor
5c Third conductor
7 Electronic element
S Step
Cp Corner Bo Boundary vicinity $S_{H1}$, $S_{H2}$, $S_{V1}$, $S_{V2}$ Stress 9a to 9f, 12a to 12e, 15a to 15e, 18a to 18e Patterned sheet

The invention claimed is:

1. An electronic element housing package comprising:
a bottom substrate;
a bank portion; and
a conductor part, wherein
the bottom substrate and the bank portion are an integrated object made of ceramic,
the bottom substrate comprises a region surrounded by the bank portion as a mounting portion for mounting an electronic element,
the conductor part comprises a first conductor, a second conductor, and a third conductor,
the first conductor is partially exposed on a surface of the mounting portion of the bottom substrate and embedded in the bottom substrate,
the third conductor is disposed on an upper surface of the bank portion and partially exposed, and
the second conductor is present between the first conductor and the third conductor inside the bottom substrate and the bank portion, and electrically connects the first conductor and the third conductor,
wherein the first conductor comprises a step in a thickness direction.

2. The electronic element housing package according to claim 1,
wherein the second conductor extends from a side surface of the first conductor along the mounting portion.

3. The electronic element housing package according to claim 2,
wherein an area of the first conductor on the surface of the mounting portion is larger than an area of the first conductor on a bottom surface of the bottom substrate opposite the mounting portion.

4. An electronic element housing package comprising:
a bottom substrate;
a bank portion; and
a conductor part, wherein
the bottom substrate and the bank portion are an integrated object made of ceramic,
the bottom substrate comprises a region surrounded by the bank portion as a mounting portion for mounting an electronic element,
the conductor part comprises a first conductor, a second conductor, and a third conductor,
the first conductor is partially exposed on a surface of the mounting portion of the bottom substrate and embedded in the bottom substrate,
the third conductor is disposed on an upper surface of the bank portion and partially exposed, and
the second conductor is present between the first conductor and the third conductor inside the bottom substrate and the bank portion, and electrically connects the first conductor and the third conductor,
wherein the first conductor is convexly curved toward the bottom surface.

5. The electronic element housing package according to claim 4,
wherein a portion of the first conductor protrudes from the surface of the mounting portion.

6. An electronic apparatus comprising;
an electronic element on the bottom substrate of the electronic element housing package according to claim 4.

7. An electronic element housing package comprising:
a bottom substrate;
a bank portion; and
a conductor part, wherein
the bottom substrate and the bank portion are an integrated object made of ceramic,
the bottom substrate comprises a region surrounded by the bank portion as a mounting portion for mounting an electronic element,
the conductor part comprises a first conductor, a second conductor, and a third conductor,
the first conductor is partially exposed on a surface of the mounting portion of the bottom substrate and embedded in the bottom substrate,
the third conductor is disposed on an upper surface of the bank portion and partially exposed, and
the second conductor is present between the first conductor and the third conductor inside the bottom substrate and the bank portion, and electrically connects the first conductor and the third conductor,
wherein the second conductor is curved from the bottom substrate to the bank portion.

* * * * *